United States Patent [19]

Shiga et al.

[11] Patent Number: 5,229,360
[45] Date of Patent: Jul. 20, 1993

[54] METHOD FOR FORMING A MULTILAYER SUPERCONDUCTING CIRCUIT

[75] Inventors: Shoji Shiga; Koki Sato; Nakahiro Harada; Kiyoshi Yamamoto, all of Tokyo, Japan

[73] Assignee: The Furukawa Electric Co., Ltd., Tokyo, Japan

[21] Appl. No.: 831,006

[22] Filed: Feb. 6, 1992

Related U.S. Application Data

[63] Continuation of Ser. No. 551,559, Jul. 11, 1990, abandoned.

[30] Foreign Application Priority Data

Jul. 24, 1989 [JP]   Japan .................................. 1-191019

[51] Int. Cl.$^5$ .......................... B05D 5/12; H01L 39/24
[52] U.S. Cl. ................................ 505/1; 505/701; 505/730; 505/731; 427/62; 427/63; 427/529; 427/404; 427/419.2; 427/419.3; 427/99; 204/192.24; 204/298.02; 156/656
[58] Field of Search .............. 505/1, 701, 730, 731; 427/62, 63, 38, 96, 99, 404, 419.2, 419.3; 156/656; 250/492.2, 492.3; 204/192.24, 298.02

[56] References Cited

U.S. PATENT DOCUMENTS

| | | | |
|---|---|---|---|
| 4,376,138 | 3/1983 | Alferness et al. | 427/160 |
| 4,758,525 | 7/1988 | Kida et al. | 437/2 |
| 4,900,709 | 2/1990 | Heijman et al. | 505/1 |
| 4,971,948 | 11/1990 | Dam et al. | 505/1 |
| 5,051,396 | 9/1991 | Yamazaki | 505/1 |

FOREIGN PATENT DOCUMENTS

| | | |
|---|---|---|
| 0282360A2 | 9/1988 | European Pat. Off. . |
| 63-258083 | 10/1988 | Japan . |
| 01-73780 | 3/1989 | Japan . |

OTHER PUBLICATIONS

Hashimoto et al, "Thermal Expansion Coefficients of High-Tc Superconductors", Jpn. J. Appl. Phys. 27(2) Feb. 1988, pp. 214–216.

*Primary Examiner*—Michael Lusigan
*Assistant Examiner*—Roy V. King
*Attorney, Agent, or Firm*—Frishauf, Holtz, Goodman & Woodward

[57] ABSTRACT

A method for forming a superconducting circuit is disclosed, comprising the steps of forming a mask pattern on a superconducting layer, forming a covering layer, containing a modifying element for superconductor, on the resultant structure, diffusing the modifying element for a superconductor, which is contained in the covering layer, into the superconducting layer to modify a corresponding location to a nonsuperconducting layer. A method for forming a multi-layer superconducting circuit is also disclosed, comprising sequentially repeating the same steps as set forth above over a substrate.

14 Claims, 2-Drawing Sheets

METHOD FOR FORMING A MULTILAYER SUPERCONDUCTING CIRCUIT

This application is a continuation of application Ser. No. 07/551,559, filed Jul. 11, 1990, now abandoned.

BACKGROUND OF THE INVENTION

1. Field of the Invention

The present invention relates to a method for forming a superconducting circuit for use for an electron element, a coil, a circuit substrate, etc.

2. Description of the Related Art

In place of a metal superconductor which produces a superconducting phenomenon at a very low temperature called a liquid helium temperature, a ceramics superconductor has been newly highlighted and actively developed in recent times, such as a ceramics superconductor producing a superconducting phenomenon at a temperature exceeding a liquid nitrogen temperature, that is, a ceramics superconductor whose critical temperature Tc is above the liquid nitrogen temperature. Recent attention has been focused particularly on a Y-Ba-Cu-O based one, such as $YBa_2Cu_3O_7-\delta$ ($\delta=0$ to 0.5) (Tc=90 to 95 K), including one obtained by replacing Y with rare earth elements; a Bi-Sr-Ca-Cu-O based one, such as $Bi_2Sr_2CaCu_2O_8$ and $Bi_2Sr_2Ca_2Cu_3O_{10}$ (Tc=80 to 110 K); and a $T\lambda$-Ba-Ca-Cu-O based one, such as $T\lambda_2Ba_2CaCu_2O_6$, $T\lambda_2Ba_2Ca_2Cu_3O_{10}$ and $T\lambda Ba_2Ca_2Cu_3O_{8.5}$ (Tc=90 to 125 K), and one obtained by partially replacing Bi, $T\lambda$ of the aforementioned two superconductors with Pb, Sb, In.

Since the ceramics superconductor displays an excellent electrical property at the critical temperature exceeding the liquid nitrogen temperature, it is with used in for example, an electronic element, an electric cable, a magnetic coil, a circuit conductor and a magnetic shield.

A method for forming a superconducting circuit is by forming a pattern, like an ordinary circuit board conductor formation method, with the use of a photosensitive resist resin and performing an etching step (a dry or a wet etching step) with the pattern used as an etching mask.

This method, however, has the drawbacks in that a circuit section is damaged by an overetch and/or sideetch at the etching step to cause a bad effect on the property of a conductor and that a dimensional error is produced for a circuit section obtained. Furthermore, as a noncircuit section is formed through removal by the etching step, an unevenness (a step) is formed over the circuit and noncircuit sections, adversely affecting a degree of flatness over the substrate and hence preventing a problem in the provision of, for example, elements in and on the substrate surface. It is, therefore, necessary to provide an insulation layer relative to the noncircuit section and to lessen uneven surfaces of the circuit and noncircuit sections.

SUMMARY OF THE INVENTION

It is accordingly the object of the present invention to provide a method for forming a superconducting circuit which can ensure an excellent flatness, the formation of a multi-layer structure and the rapid formation of a desired fine pattern, presents no specific etching problem, such as a side-etch, and can be applied to a ceramics superconductor which is favorably used for electronic devices, etc. and which is readily subjected to a cooling at a critical temperature exceeding a liquid nitrogen temperature.

In one aspect of the present invention, there is provided a method for forming a superconducting circuit, comprising the steps of forming a mask pattern on a a superconducting layer; forming a covering layer, containing a modifying element for superconductor, on the surface of a resultant structure; and diffusing the modifying element for a superconductor, which is contained in the covering layer, into the superconducting layer to modify a corresponding location to a nonsuperconducting layer which is the same in crystal structure as the superconducting layer.

Furthermore, a multi-layered superconducting circuit is created by sequentially repeating the steps of forming a superconducting layer, by an epitaxial growth, as a second layer on a partially modified superconducting layer which is formed as a first layer; forming a mask pattern on a second superconducting layer; forming a covering layer, containing a modifying element for a superconductor, on the surface of a resultant structure; and diffusing the modifying element for a superconductor, which is contained in the covering layer, into the corresponding superconducting layer to modify a corresponding location to a nonsuperconducting layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

In the present invention, a superconductor for use as a superconducting layer may be of either a ceramics superconductor such as Y-Ba-Cu-O, Bi-Sr-Ca-Cu-O and $T\lambda$-Ba-Ca-Cu-O based superconductor or a metals superconductor such as Nb and NbTi.

A mask pattern is formed on a superconducting layer by a usual method, such as photolithography.

In general, an ordinary method for forming a thin film, such as sputtering, vapor deposition and ion plating, may be employed to form a coating layer containing a modifying element for a superconductor. The thickness of the covering layer can be so set as to modify a superconducting layer to allow its physical property, such as Tc, to vary. In the ceramics superconductor as set forth above, the choice of any particular element can largely vary the physical property of the superconductor of a thin film.

The modifying element for a superconductor, contained in the covering layer, may be employed so long as it can be diffused in the superconductor by a predetermined treatment to allow the superconductor to be modified, such as to vary the Tc of the superconductor. Taking $YBa_2Cu_3O_7$ by way of example, many elements may be employed, but especially effective ones are of such a type as to replace Cu in a crystal structure, such as Zn, Aλ, Ga, Fe, Co, Ni, La, Cd and Be. This is because a high temperature superconductor containing a copper oxide has its copper, such as a $Cu-O_2$ plane, directly related to the superconductor. $YBa_2Cu_3O_7$ is orthorhombic, but Zn, Ni, etc. of the aforementioned modifying elements, while sustaining an orthorhombic structure, lessens Tc, etc., and are transformed into a form eventually classified as a tetragonal system whose lattice constant alone is somewhat different. Furthermore, Fe, Co, etc. are, if being added to the superconductor in a small quantity, transformed into a tetragonal system with Tc gradually decreased.

The amount of modifying element, though being not uniform depending upon the conditions employed, falls nearly within a 1 to 40 atomic % range based on the amount of superconductor and can experimentally be selected. Although the conditions under which an epitaxial growth is carried out cannot be uniformly determined depending also upon the deposition condition as well as the method and materials employed, the present invention is based on the conditions under which the superconductor is of an identical or nearly identical crystal structure, such as a tetragonal and an orthorhombic structure.

A method for diffusing a modifying element for superconductor, contained in a covering layer, into the superconducting layer, if being so done readily and rapidly, may be employed. As one such method, use can be made of, for example, a thermal diffusion treatment in which case the heating temperature is preferably 200° to 1000° C.

Figure 1:
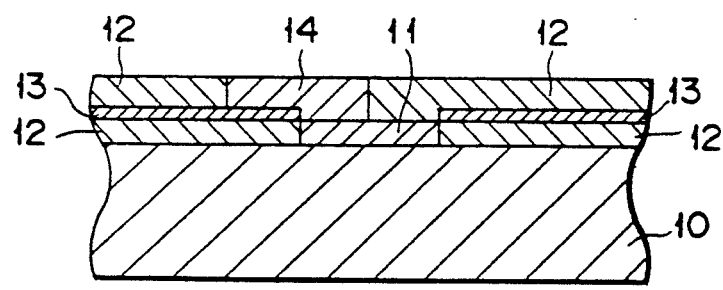
FIG. 1 is a cross-sectional view showing a multi-layered circuit which is obtained by a method for forming a superconducting circuit of the present invention.

It may also be possible to employ the steps of forming a superconducting layer, as a second layer, on a partially modified superconducting layer, forming a mask pattern on a resultant structure, forming a covering layer containing a modifying element for the superconductor and diffusing the modifying element in the covering layer into the superconducting layer (second layer) as in the formation of the first layer to provide a two- or more layered superconducting circuit. In order to prevent the modifying element in the covering layer which is diffused into on superconducting layer from being diffused into another superconducting layer, a buffer layer may be formed between an underlying superconducting layer and an overlying superconducting layer. The buffer layer serves the purpose, if it has a crystal structure of a better matching to the superconductor, and may be selected from a material, such as MgO, $SrTiO_3$, $AλGaO_3$, $ZrO_2$, $BaZrO_3$, $LaAlO_3$, etc. A conduction between the respective layers can be readily achieved, as shown in FIG. 1, by arranging a buffer layer 13 on only the noncircuit section 12 of the circuit section 11 and noncircuit section 12 both formed on the substrate 10 and overlapping arranging the circuit section 14 of the second layer on the circuit section 11 of the first layer.

The method for forming a superconducting circuit of the present invention comprises forming a mask pattern on a superconducting layer, forming a covering layer, containing a modifying element for a superconductor on a resultant structure and diffusing the modifying element in the covering layer by, for example, a heating method to selectively modify the superconductor at a corresponding location. As a result, the noncircuit section of the superconducting layer has its critical temperature Tc dropped below less than 77 K, a liquid nitrogen temperature at which a superconducting phenomenon occurs, so that the electrical resistance of the noncircuit section is increased. When this occurs, the circuit section alone becomes a conductor at the critical temperature Tc of the superconductor, creating a superconducting circuit.

It is, thus, possible according to the present invention to readily form a multi-layer superconducting circuit structure whose circuit surface is flat because an otherwise required etching step is employed. In this case, the noncircuit section having its specific element diffused therein takes on a crystal structure nearly similar to a superconductor and a subsequent layer can be formed as an epitaxially oriented layer. According to the present invention, it is possible to realize a multi-layer structure where, for example, a c-axis of a practical crystal is oriented perpendicular to a substrate. A superconductor thus obtained displays an anisotropic crystal structure, such as a two-dimensional nature, and a better superconductivity.

The present invention will be explained below with reference to the accompanying examples.

EXAMPLE 1

Figure 2A:
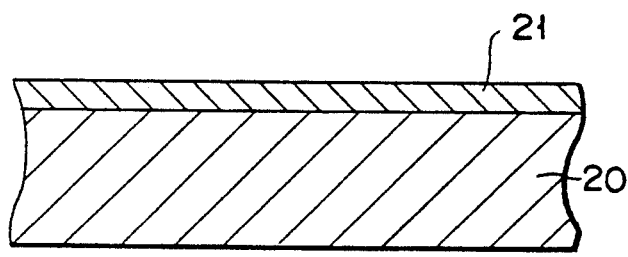
FIGS. 2A, 2B, 2C and 2D are cross-sectional views showing the each step for forming a superconducting circuit in the present invention.

With an MgO (100)-face substrate mounted on a magnetron sputtering apparatus, $YBa_{2.1}Cu_{2.2}Ox$ was sputtered onto a substrate being heated to 650° C., wit the use of a target of the ceramics superconductor $YBa_{2.1}Cu_{2.2}Ox$ (x=7.1). By so doing, a 0.3 μm-thick superconducting layer was formed on the substrate. The sputtering was done under conditions of an electric power of 250 W and atmosphere gas pressure of 100 mTorr $(Ar+50\%O_2)$ with a c-axis orientation. FIG. 2A is a cross-sectional view showing a substrate with a superconducting layer formed thereon.

In FIGS. 2A, 20 and 21 show a substrate and superconducting layer, respectively. The substrate with the superconductor formed thereon was heated at 900° C. for 30 minutes and thereafter annealed at a rate of 2° C./min.

Figure 2B:
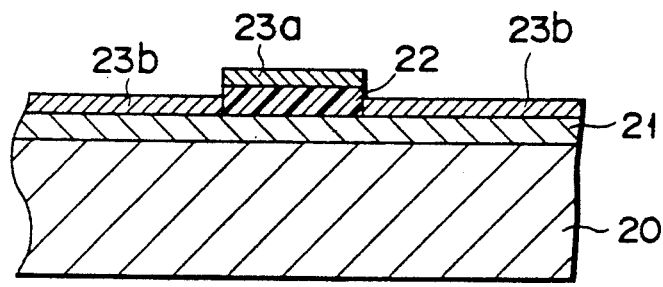

The coating of a photosensitive resist resin as a resist onto the superconducting layer 21 and the light exposure of the resultant structure were carried out in an ordinary method to form a 4 μm wide×100 μm long mask pattern 22 with a 100 μm square pad formed at opposite ends (FIG. 2B).

Figure 2C:
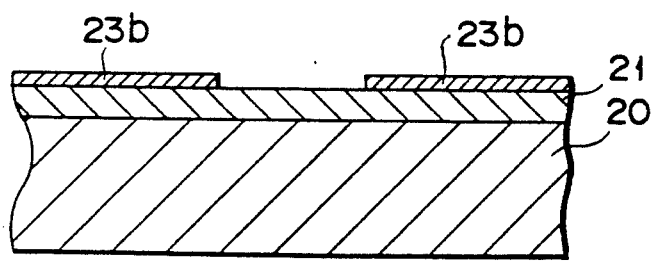
Figure 2D:
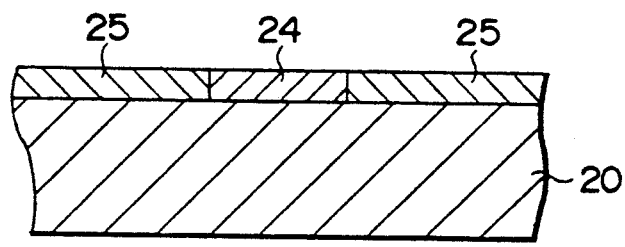

Sputtering was done onto the whole surface of a resultant structure in the same way as set forth above to form a Zn layer to a thickness of 0.04 μm. FIG. 2B is a cross-sectional view showing a substrate with a covering layer formed thereon. In FIG. 2B, 23a shows a Zn layer corresponding to a circuit section formation area and 23b, a Zn layer corresponding to an area where no circuit section is formed, noting that these Zn layers are separated from each other in a manner to provide a stepped surface over the substrate. The mask pattern 22 and overlying Zn layer 23a were lifted off the substrate 20. Thereafter, resultant substrate structure was heated, for 2 hours, at 450° C. in an Ar gas stream and then, for 4 hours, at 500° C. in an $O_2$ stream with which that preceding gas atmosphere was replaced. In this way, Zn in the Zn layer 23b was diffused into the superconducting layer 21 to create a superconducting circuit. FIG. 2C is a cross-sectional view showing a substrate structure with the Zn layer removed by a lift-off step and FIG. 2D is a cross-sectional view showing a substrate structure with the aforementioned thermal diffusion done. In FIG. 2D, 24 shows a circuit section and 25, a noncircuit section.

The circuit section of the superconducting circuit thus created revealed Tc=85 K and Jc (current density) $=1.3 \times 10^6$ $A/cm^2$ at 77 K. The noncircuit section of the aforementioned superconducting circuit manifested Tc=30 K in an ON set state, and an OFF set state of Tc showing an electrical resistance of zero was not actually evaluated until 4.2 K. The circuit and noncircuit sections, upon being analytically examined by an X-ray diffraction apparatus, revealed a c-axis oriented orthorhombic system having a lattice constant in the c-axis direction of 11.67 Å and 11.74 Å, respectively.

EXAMPLE 2

A $YBa_{2.1}Cu_{2.2}Ox$ superconducting circuit was created in the same method as in Example 1, except that 0.03 μm thick Aλ layer was employed in place of the 0.04 μm thick Zn layer.

The circuit section of the superconducting circuit thus obtained was found to be Tc=85 K and Jc=$1.2 \times 10^6$ $A/cm^2$ at 77 K. The noncircuit section of the superconducting circuit revealed Tc=55 K in an ON set state and Tc=15 K in an OFF set state. The circuit and noncircuit sections of the superconducting circuit were analytically examined by an X-ray diffraction method, showing a c-axis oriented orthorhombic system having a lattice constant in the c-axis direction of 11.68 Å and 11.71 Å, respectively.

EXAMPLE 3

A $YBa_{2.1}Cu_{2.2}Ox$ superconducting circuit (first layer) was formed in the same method as in Example 1.

Figure 3:
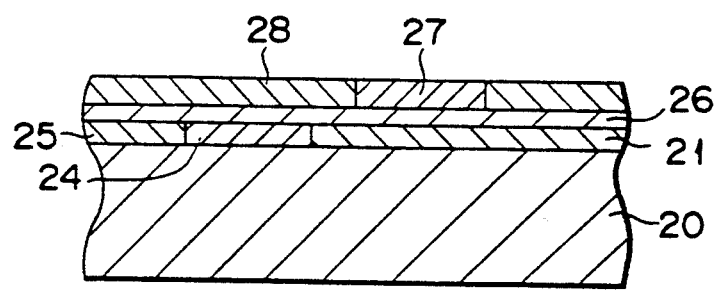
FIGS. 3 and 4 are cross-sectional views showing other multi-layered circuits which are obtained by a method for forming a superconducting circuit of the present invention.

A 0.05 μm-thick $SrTiO_3$ layer was formed, as a buffer layer, over the whole surface of the aforementioned superconductor circuit (first layer). A 0.3 μm-thick $YBa_{2.1}Cu_{2.2}Ox$ superconducting circuit (second layer) was formed over the buffer layer in the same method as in Example 1. FIG. 3 is a cross-sectional view showing a substrate after the second layer (superconductor circuit) was formed, noting that 26 shows a buffer layer; 27, the circuit section of the second layer; and 28, a noncircuit section of the second layer.

The circuit section of the superconducting circuit was found to be Tc=84 K and Jc=$1.05 \times 10^6$ $A/cm^2$ at 77 K. The circuit and noncircuit sections were analytically X-ray diffracted to exhibit a c-axis oriented orthorhombic system with their lattice constant in the c-axis direction of 11.66 Å and 11.73 Å, respectively.

EXAMPLE 4

A two-layered superconducting circuit was formed, in the same method as in Example 3, except for the formation of a buffer layer.

The circuit section of the superconducting circuit thus obtained was found to be Tc=84 K and Jc=$0.85 \times 10^6$ $A/cm^2$ at 77 K. The circuit and non-circuit sections were analyzed by an X-ray diffraction method, revealing a c-axis oriented orthorhombic system having a lattice constant in the c-axis direction of 11.67 Å and 11.74 Å, respectively.

EXAMPLE 5

Figure 4:
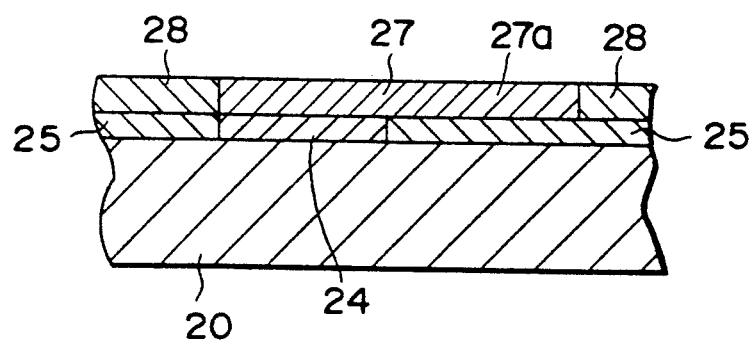

A circuit (first layer) was formed as in the same method as in Example 2 and a second circuit (second layer) was formed as in the same method as in Example 4 at which time the second layer (superconducting layer) was formed to a thickness of 0.6 μm and a modifying Aλ deposition layer was 0.03 μm in thickness. From FIG. 4 it is appreciated that the first and second layers (first and second circuits) 24 and 27 are conducted to each other. The circuit and noncircuit sections of the second layer, being examined by an X-ray diffraction method, were found to be a c-axis oriented orthorhombic system having a lattice constant in the c-axis direction of 11.67 Å and 11.73 Å, respectively. The first and second layers, being electrically connected together, were evaluated, showing Tc=83 K and Jc=$1.3 \times 10^6$ $A/cm^2$ at 77 K. The noncircuit section (the second layer) was found to be Tc=59 K in an ON set state and Tc=30 K in an OFF set state.

CONTROL 1

The circuit sections of the first and second layers were deposited, as in Example 3, to a thickness of 0.1 μm. When the noncircuit sections of the first and second layers were examined by an X-ray diffraction method, ZnO was detected there, hardly detecting the formation of a superconducting layer. The circuit section of the second layer was found not oriented in an c-axis direction and stayed at Tc=80 K and Jc=$1.5 \times 10^3$ $A/cm^2$.

CONTROL 2

An Aλ deposition layer was formed, as in Examples 5, to a thickness of 0.1 μm and the noncircuit sections of the first and second layers revealed no superconductive phase. A circuit portion (corresponding to a section 27a in FIG. 4) overlying the noncircuit section of the first layer, which occupied the major section of the circuit section of the second layer, was analytically examined by an X-ray diffraction method, showing no specific crystal orientation. The circuits of the first and second layers, upon being evaluated therethrough, stayed at Tc=80 K and Jc=$0.9 \times 10^3$ $A/cm^2$ at 77 K.

As set forth above, the present method for the manufacture of a superconducting circuit ensures a better planarization and a rapid formation of a desired, very fine pattern without causing any specific etch problem, such as a side-etch. It is also possible to properly apply the present method to a multi-layered structure and to construct a superconductor-applied apparatus as a highly sophisticated unit.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for forming a multi-layer superconducting circuit structure having multiple superconducting layers, comprising the steps of:
   (1) epitaxially growing a ceramic superconducting layer on a substrate;

(2) forming a mask pattern on a circuit portion of said ceramic superconducting layer;

(3) covering the surface of said ceramic superconducting layer, including said circuit portion having said mask pattern formed thereon and a non-circuit portion not having said mask pattern formed thereon, with a covering layer comprising a modifying element selected from the group consisting of Zn, Ga, Fe, Co, Ni, La, Cd and Be, for lowering the critical temperature of said ceramic superconducting layer;

(4) removing from said circuit portion of said ceramic superconducting layer said mask pattern together with said covering layer formed thereon to form a partially covered ceramic superconducting layer still covered by said covering layer in said non-circuit portion;

(5) heating said partially covered ceramic superconducting layer so as to thermally diffuse said modifying element from said covering layer into said non-circuit portion of said ceramic superconducting layer, thereby forming a layer of a superconducting circuit structure including a superconducting circuit portion and a non-superconducting non-circuit portion, said circuit portion having a critical temperature of more than 77K, and said non-circuit portion having a critical temperature less than 77K and a crystal structure the same as or similar to that of the circuit portion; and (6) repeating at least once on said layer of said superconducting circuit structure said steps (1) to (5) to thereby form said multi-layer superconducting circuit structure having said multiple superconducting layers.

2. The method according to claim 1 wherein a diffusion amount of the modifying element is below a range in which a crystal structure of the ceramic superconducting layer is sustained after said diffusing has been performed.

3. The method according to claim 1, wherein said ceramic superconducting layer is selected from the group consisting of a Y-Ba-Cu-O superconductor and a Tλ-Ba-Ca-Cu-O superconductor.

4. The method according to claim 1, wherein said mask pattern is formed by a photolithography method.

5. The method according to claim 1, wherein said covering layer comprising said modifying element is formed by a forming method selected from the group consisting of sputtering, vapor deposition and ion plating.

6. The method according to claim 1, wherein the heating step 5 is performed at a temperature of 200° C. to 1000° C.

7. The method according to claim 1, wherein a buffer layer is provided between layers of said multi-layer superconducting circuit structure.

8. The method according to claim 7, wherein said buffer layer is made of a material selected from the group consisting of MgO, $SrTiO_3$, $A\lambda GaO_3$, $ZrO_2$, $BaZrO_3$ and $LaAlO_3$.

9. The method according to claim 1, wherein said ceramic superconducting layer comprises a Y-Ba-Cu-O superconducting layer.

10. The method according to claim 1, wherein said ceramic superconducting layer comprises $YBa_{2.1}Cu_{2.2}O_{7.1}$.

11. The method according to claim 1, wherein said heating step 5 is performed at a temperature of 200° C. to 1000° C.; said covering layer is formed by a forming method selected from the group consisting of sputtering, vapor deposition and ion plating; and said mask pattern is formed by a photolithography method.

12. The method according to claim 11, wherein said ceramic superconducting layer comprises $YBa_{2.1}Cu_{2.2}O_{7.1}$.

13. The method according to claim 7, wherein said ceramic superconducting layers comprise a Y-Ba-Cu-O superconductor; said heating step 5 is performed at a temperature 200° C. to 1000° C.; said covering layer is formed by a forming method selected from the group consisting of sputtering, vapor deposition and ion plating; and said mask pattern is formed by a photolithography method.

14. The method according to claim 7, wherein said buffer layer comprises $SrTiO_3$ and said ceramic superconducting layers comprise $YBa_{2.1}Cu_{2.2}O_{7.1}$.

* * * * *